(12) United States Patent
Auricchio et al.

(10) Patent No.: US 7,088,135 B2
(45) Date of Patent: Aug. 8, 2006

(54) NONVOLATILE SWITCH, IN PARTICULAR FOR HIGH-DENSITY NONVOLATILE PROGRAMMABLE-LOGIC DEVICES

(75) Inventors: Chantal Auricchio, Cernusco sul Naviglio (IT); Michele Borgatti, Finale Emilia (IT); Pier Luigi Rolandi, Monleale (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/760,637

(22) Filed: Jan. 20, 2004

(65) Prior Publication Data

US 2004/0233736 A1    Nov. 25, 2004

(30) Foreign Application Priority Data

Apr. 10, 2003   (EP)   .................................. 03425225

(51) Int. Cl.
*H03K 19/177*   (2006.01)
(52) U.S. Cl. .............................. 326/41; 326/38; 326/47
(58) Field of Classification Search ............ 326/37–38, 326/47–50, 41, 44, 101; 365/185.01, 185.05, 365/185.08, 185.14
See application file for complete search history.

(56) References Cited

U.S. PATENT DOCUMENTS

| | | | |
|---|---|---|---|
| 5,015,885 A | 5/1991 | El Gamal et al. ............ 307/465 |
| 5,247,478 A * | 9/1993 | Gupta et al. .............. 365/185.1 |
| 5,576,568 A | 11/1996 | Kowshik ..................... 257/318 |
| 5,587,603 A | 12/1996 | Kowshik ..................... 257/316 |
| 5,625,211 A | 4/1997 | Kowshik ..................... 257/317 |
| 5,764,096 A * | 6/1998 | Lipp et al. .................. 327/434 |
| 5,949,710 A * | 9/1999 | Pass et al. ............. 365/185.05 |
| RE37,308 E | 8/2001 | Cappelletti et al. ......... 257/318 |
| 6,456,529 B1 * | 9/2002 | Sansbury et al. ........ 365/185.1 |

OTHER PUBLICATIONS

Borgatti, M. et al., "A Multi-Context 6.4Gb/s/Channel On-Chip Communication Network Using 0.18 μm Flash-EEPROM Switches and Elastic Interconnects," *STMicroelectronics*, Feb. 12, 2003.

* cited by examiner

*Primary Examiner*—Anh Q. Tran
(74) *Attorney, Agent, or Firm*—Lisa K. Jorgenson; Dennis M. de Guzman; Seed IP Law Group PLLC

(57) ABSTRACT

A nonvolatile switch has: an input terminal; an output terminal; a selection terminal; a first and a second biasing terminal; a memory element of flash type, having a first conduction region connected to the first biasing terminal and a second conduction region connected to the second biasing terminal; a pass transistor, having a first conduction region connected to the input terminal and a second conduction region connected to the output terminal; and a common floating gate region and a common control gate region, which are capacitively coupled together. The memory element and the pass transistor share the common-gate regions, and the common control gate region is connected to the selection terminal.

11 Claims, 6 Drawing Sheets

|  | FLASH READ | WRITE | ERASE | USER MODE |
|---|---|---|---|---|
| FD | 1V | 4.2V | Float | Float |
| FS | GND | GND | 9V | GND |
| PD | - | - | - | Digit 1/0 |
| PS | - | - | - | Digit 1/0 |
| CG | VG READ | 9V | -8V | VG USER |
| B | GND | -1.2 | 9V | GND |

Fig. 7

NONVOLATILE SWITCH, IN PARTICULAR FOR HIGH-DENSITY NONVOLATILE PROGRAMMABLE-LOGIC DEVICES

BACKGROUND OF THE INVENTION

1. Field of the Invention

The present invention relates to a nonvolatile switch, in particular for high-density nonvolatile programmable-logic devices.

2. Description of the Related Art

As known, programmable-logic devices are currently mainly formed by RAMs, which must be written each time the device is turned on. It is therefore necessary to provide an external memory that contains the code to be loaded at turning-on.

To eliminate the above need, programmable-logic devices, based upon nonvolatile components, have already been proposed. A solution is disclosed in U.S. Pat. No. 5,015,885, wherein a nonvolatile cell (EPROM or EEPROM) operates directly as a switch for connecting or separating horizontal and vertical segments formed by pass transistors. However, this solution is problematical as regards management of the switches, since they carry out two different functions and hence require a separate encoding for each function.

In other solutions, disclosed for example in U.S. Pat. NO. 6,625,221 and U.S. Pat. No. 5,576,568, a floating strip of polysilicon forming the gate electrode of a pass transistor is prolonged and used as the first plate of a capacitor, the second plate whereof is connected to a terminal of a coupling transistor. The polysilicon strip moreover forms the floating gate of an EEPROM cell or a plate of a further coupling capacitor to enable injection or extraction of charges from the polysilicon strip and hence programming and erasing of the cell. Also, these solutions are disadvantageous, since they require a large area and cannot be integrated in a memory array. Programming of the cells moreover requires high voltages, which are hardly from compatible with the devices and circuits integrated in the same chip.

BRIEF SUMMARY OF THE INVENTION

The aim of the present invention is thus to provide a nonvolatile switch overcoming the drawbacks indicated above.

According to the present invention, a nonvolatile switch and a method for controlling a nonvolatile switch are provided, as defined in claim 1 and 9, respectively.

According to one aspect of the present invention, the switch is formed by a flash cell and a pass transistor, which have a common floating-gate region. The flash cell enables modification of the charges contained in the floating-gate region by channel hot-electron injection (writing) and extraction by Fowler-Nordheim (FN) tunneling effect (erasing), and hence modulation of the threshold of the pass transistor. The pass transistor therefore has a variable threshold, which depends upon the charge present in the floating-gate region. The flash cell and the pass transistor also share the control-gate region. The pass transistor is connected to the outside of the cell and enables or not passage of the logic signals from the input terminal to the output terminal according to the threshold programmed. If the threshold of the pass transistor is sufficiently low, once it has been selected through its control gate region, it outputs the logic signal present at input. If, instead, the threshold of the pass transistor is high, it is off even when it is selected and does not enable passage of the logic signal.

BRIEF DESCRIPTION OF THE SEVERAL VIEWS OF THE DRAWINGS

For an understanding of the present invention there are now described some preferred embodiments thereof, which are provided purely by way of non-limiting example, with reference to the attached drawings, wherein:

FIG. 7 is a table corresponding to the biasings supplied to the switch according to the invention.

DETAILED DESCRIPTION OF THE INVENTION

Figure 1:
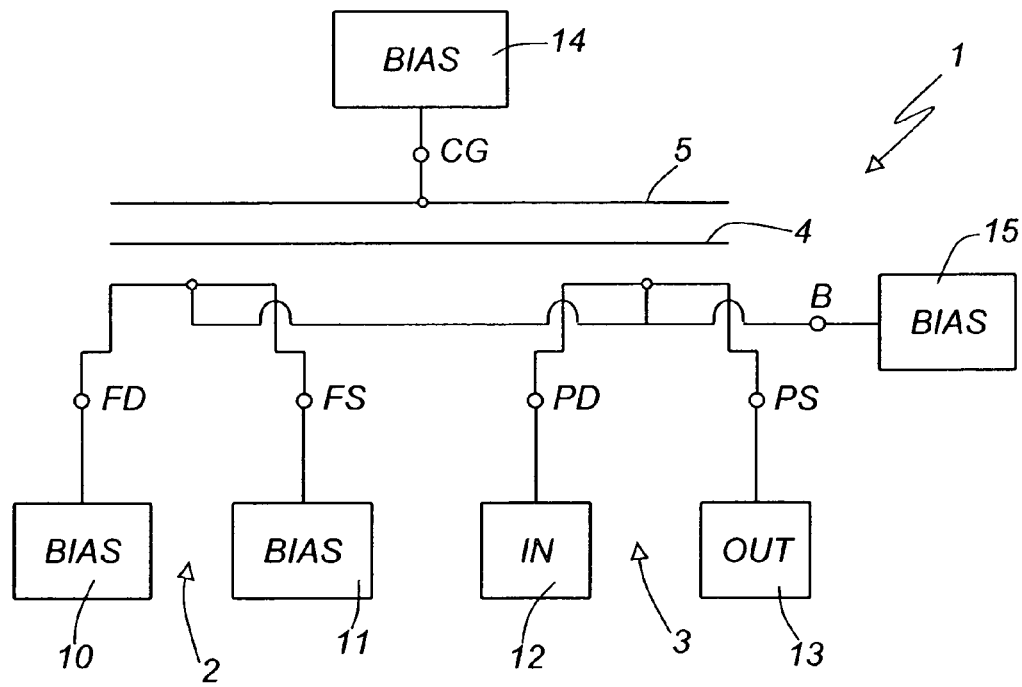
FIG. 1 illustrates the equivalent electrical circuit of a switch according to a first embodiment of the invention.

FIG. 1 shows a switch 1 comprising a memory element 2, of a flash type, and a pass transistor 3, which have a same floating-gate region 4 and a same control-gate region 5. In practice, the memory element 2 and the pass transistor 3 share the gate regions 4, 5.

In detail, the memory element 2 has a drain terminal FD connected to a first bias generator 10 and a source terminal FS connected to a second bias generator 11. The pass transistor 3 has a drain terminal PD connected to a data input 12 and a source terminal PS connected to a data output 13. In addition, the control-gate region 5 is connected by a terminal CG to a third bias generator 14, and a body region B, in common both to the memory element 2 and to the pass transistor 3, is connected to a fourth generator 15.

The table of FIG. 7 illustrates by way of example the biasings supplied to the terminals FD, FS, PD, PS, CG, and B in the different operating conditions of the switch 1. In particular, the table shows the biasing conditions during writing of the memory element 2, by channel hot-electron injection, and during erasing, by FN tunneling effect, when suitable voltages are applied to the drain terminal FD, source terminal FS, floating-gate terminal CG, and body terminal B, while the pass transistor is inoperative and its terminals PS and PD are floating. Instead, during turning on and off of the switch, the drain terminal of the memory element 2 is maintained floating, the source terminal is grounded, and the digital datum (bits 0 or 1, with a voltage linked to the technology used) is supplied at the input 12 of the pass transistor 3. As indicated, if the memory element 2 is erased, the threshold voltage of the pass transistor 3 is low, and the digital datum can be supplied on its output 13. Instead, if the memory element 2 is written, the threshold of the pass transistor 3 is high, and the digital datum is not supplied on the output 13.

The table of FIG. 7 also indicates the biasings that enable reading of the memory element 2 for verifying the set threshold.

Figure 2:
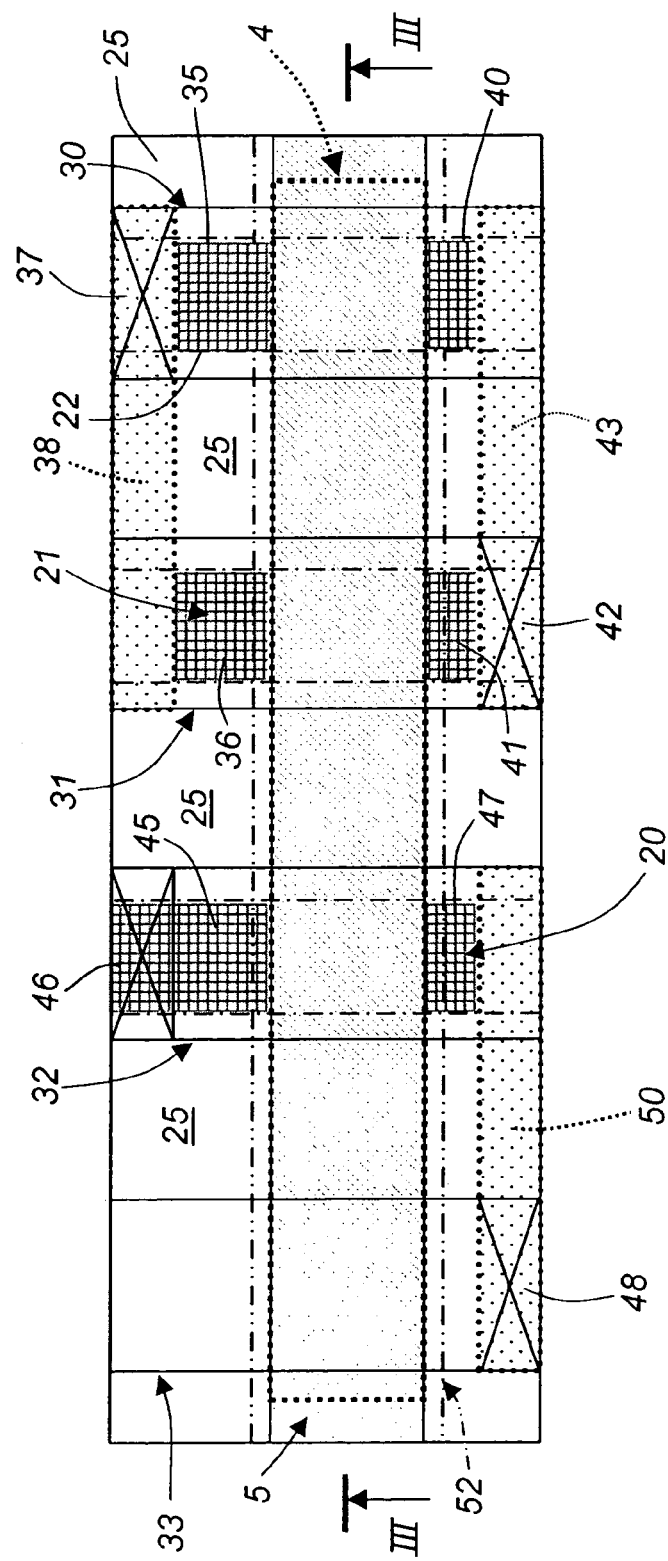
FIG. 2 shows the layout of a first implementation of the switch of FIG. 1.
Figure 3:
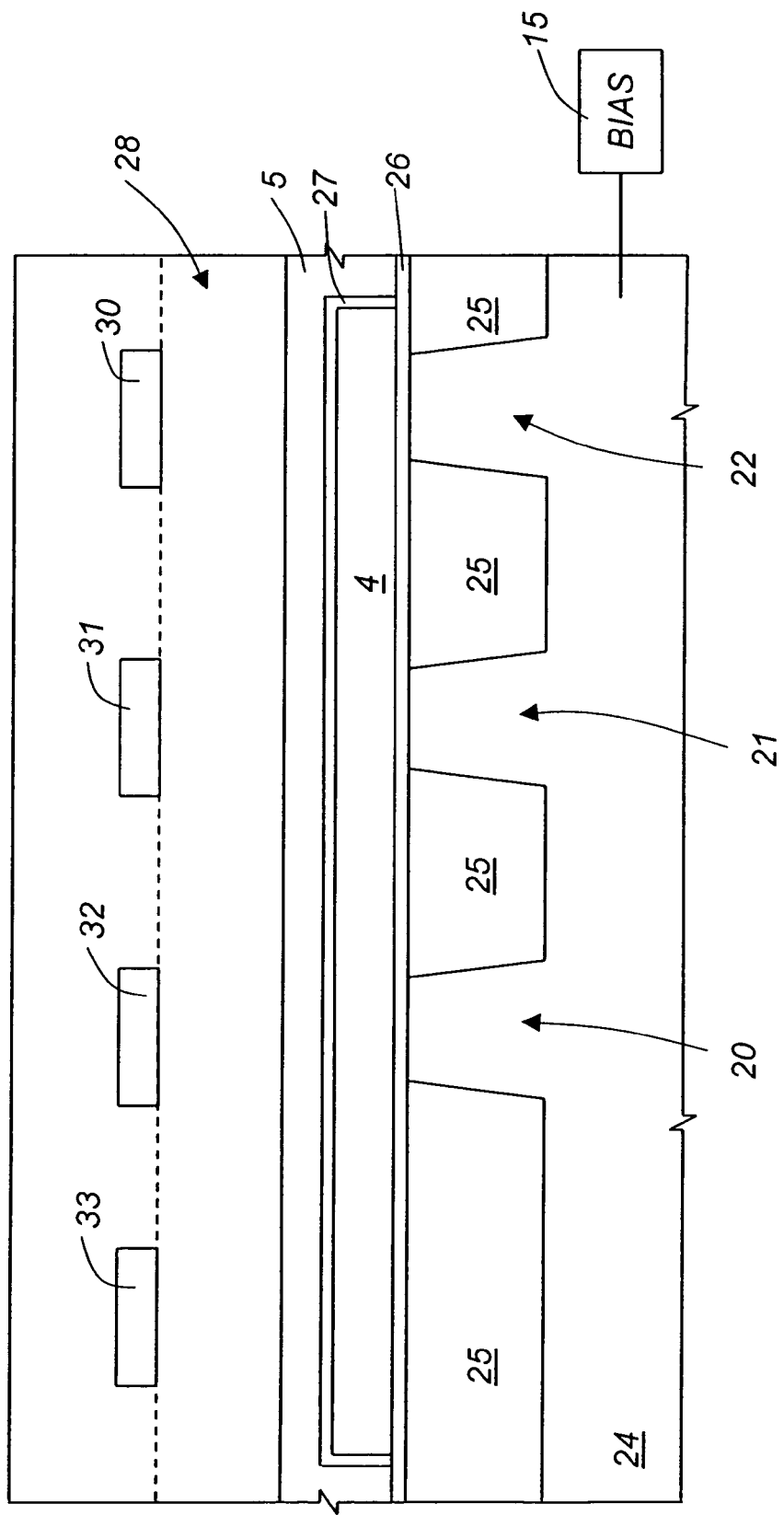
FIG. 3 is a cross-section taken along line III—III of FIG. 2.

The switch 1 can be implemented in a very compact way, as is illustrated by way of example in the layout of FIG. 2 and in the cross-section of FIG. 3.

In particular, in the illustrated embodiment, the memory element 2 is made in a first active area 20, and the pass transistor 3 is made in a second and a third active areas 21, 22. The active areas 20–22 extend parallel to one another in a well region 24 (see FIG. 3) of semiconductor material and are electrically separated from one another by field-oxide regions 25.

On top of the well 24, there extend, in order (see FIG. 3): a gate oxide layer 26; the floating gate region 4; an interpoly dielectric layer 27; the control gate region 5; and a top dielectric region 28. The top dielectric region, formed by various layers, accommodates a pass source connection line 30, a pass drain connection line 31, a memory source connection line 32, and a memory drain connection line 33, all formed in a same metal layer (metal 1).

As may be noted in FIG. 2, the pass source connection line 30 is connected to pass source regions 35, 36 formed in the second active area 21 and the third active area 32, through a first contact 37 and a source local-interconnection line (LIL) 38, formed directly on top of the substrate 24 between the pass source regions 35 and 36. Likewise, the pass drain connection line 31 is connected to pass drain regions 40, 41 formed in the second active area 21 and the third active area 22, through a second contact 42 and a drain local-interconnection line 43, formed directly on top of the substrate 24 between the pass drain regions 40 and 41.

In practice, the pass transistor 3 comprises two pass transistors formed in two adjacent active areas (second and third active area 21, 22) and parallel-connected so as to operate as a single pass transistor 3 with an area sufficient to conduct the required current.

In addition, the memory source connection line 32 is connected to a memory source region 45 formed in the first active area 20, through a third contact 46. Instead, the memory drain connection line 33 is connected to a memory drain region 47 formed in the first active area 20, through a fourth contact 48 and a memory local-interconnection line 50, formed directly on top of the substrate 24 between the memory drain region 47 and the fourth contact 48.

Figure 4:
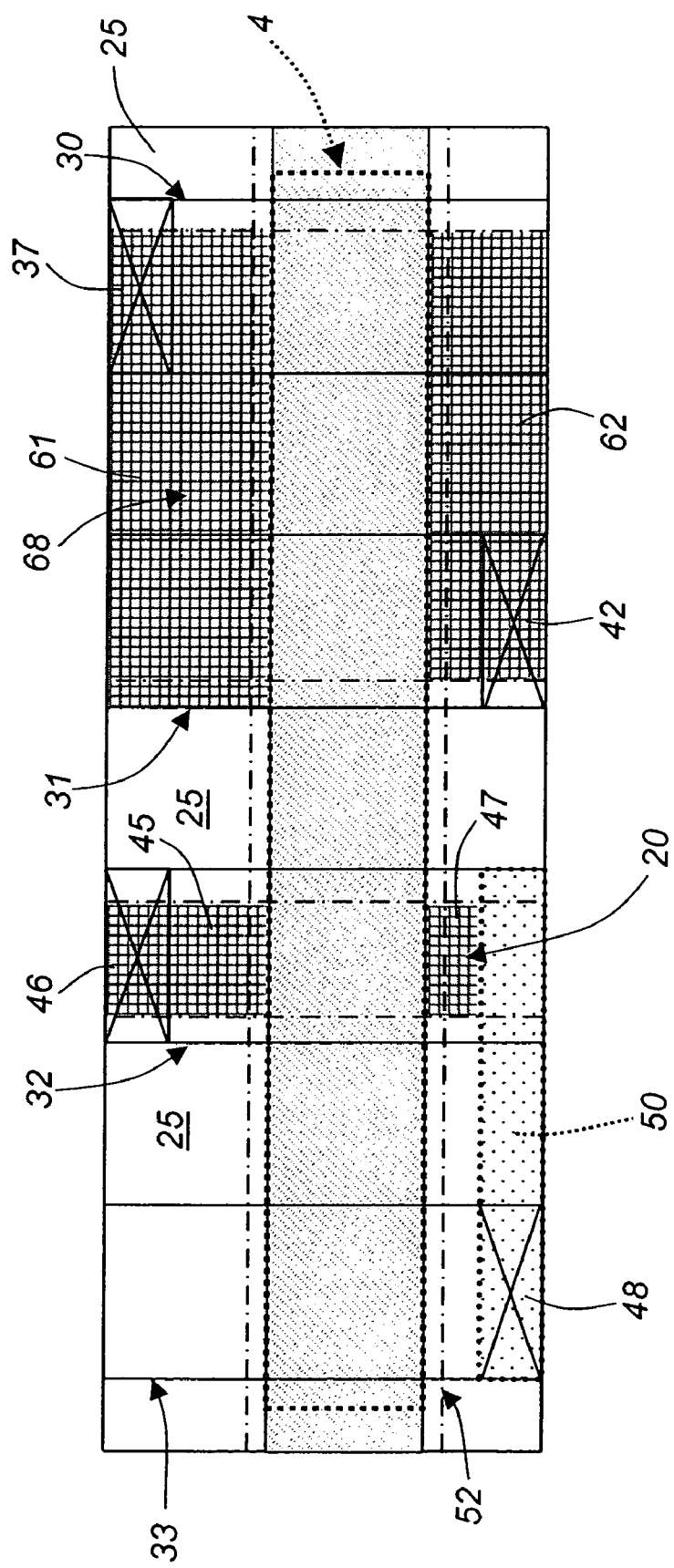
FIG. 4 is the layout of a second implementation of the switch of FIG. 1.
Figure 6:
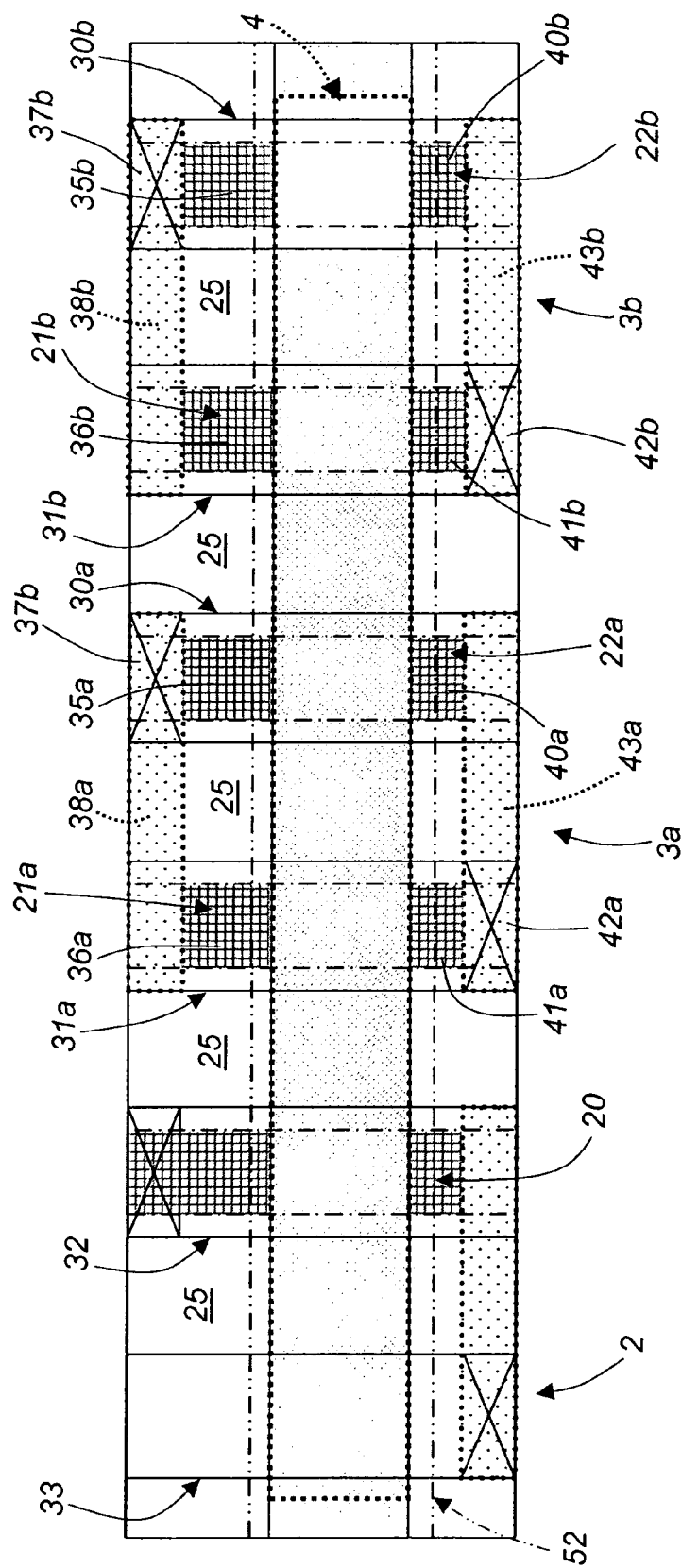
FIG. 6 is the layout of an implementation of the switch of FIG. 5.

FIG. 4 illustrates a variant of the layout of FIG. 2, wherein the pass transistor 3 is formed in a single active area 60 corresponding to the area of the second and third active areas 21, 22 and of the intermediate field oxide region 25 of FIG. 2. Consequently, just one pass source region 61 is connected to the pass source connection line 30 only through a first contact 37, and one pass drain region 62 is connected to the pass drain connection line 30 though the second contact 42.

Figure 5:
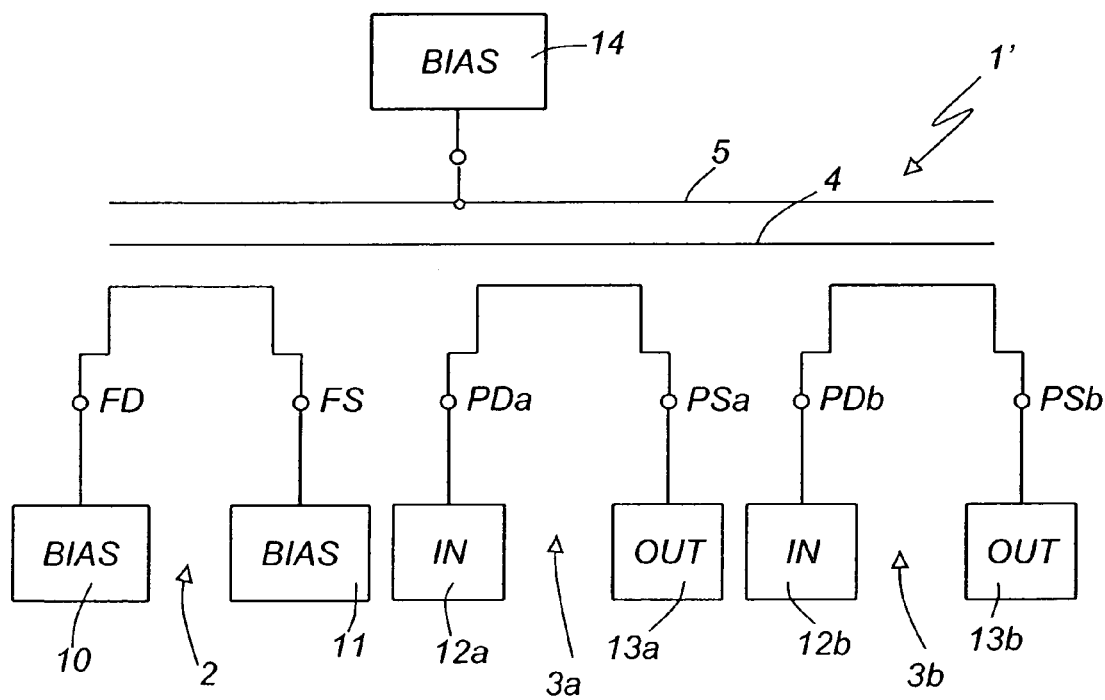
FIG. 5 illustrates the equivalent electrical circuit of a second embodiment of the switch according to the invention.

FIG. 5 illustrates the electric diagram of a different embodiment, wherein a same memory element 2 is associated to more pass transistors, here two pass transistors 3a, 3b, so as to form a multiple switch 1'.

Analogously to what illustrated in FIG. 1, the pass transistors 3a, 3b share the floating-gate region 4 and control-gate region 5. Each pass transistor moreover has a drain terminal PDa, PDb connected to a respective data input 12a, 12b and a source terminal Psa, PSb connected to a respective data output 13a, 13b.

This solution proves advantageous when the pass transistors are to be configured in the same way and selected simultaneously (for example, for connection to a bus), thanks to the saving in the occupied area that can be obtained.

Also, the above embodiment enables different embodiments of the layout. For example, the four active areas forming the pass transistors 3a, 3b can be joined in pairs, as illustrated in FIG. 4.

Thanks to the described structure, it is possible to obtain a nonvolatile switch with an extremely reduced area. In addition, the described switches can be made using standard technology for manufacturing flash cells, and hence using machines commonly available in the microelectronics industry and known and reliable processing steps. The use of a flash memory element further enables also negative voltages to be used, with a consequent reduction of the amplitude of the voltages applied.

In addition, it is possible to form the switch within a flash-memory array, and hence in a still more compact way. In this case, the connection lines 30–33 operate as bitlines, and the control-gate region 5 operates as a wordline.

Finally, it is clear that numerous modifications and variations can be made to switch described and illustrated herein, all of which fall within the scope of the invention, as defined in the attached claims. For example, also the memory element 2 can be formed in two distinct active areas, and the floating gate region can be shortened so as to end above the first active area 20 (see FIG. 3). In addition, since the pass transistor 3 is a symmetrical element, the data input 12 and the data output 13 can be connected to the drain terminal PD and the source terminal PS in an opposite way with respect to what is illustrated.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A nonvolatile switch, comprising:
   an input terminal;
   an output terminal;
   a selection terminal;
   a first and a second biasing terminal;
   a memory element of flash type, having a first conduction region coupled to said first biasing terminal and a second conduction region coupled to said second biasing terminal;
   a pass transistor, having a first conduction region coupled to said input terminal and a second conduction region coupled to said output terminal;
   a pair of common-gate regions, having a common floating gate region and a common control gate region, which are capacitively coupled together, said memory element and said pass transistor sharing said common-gate regions and integrated adjacent to each other, and said common control gate region being coupled to said selection terminal; and
   a body of semiconductor material that accommodates a first and a second active area separated by an insulating region, said common-gate regions extending in a direction transverse to, and on top of, said first and second active areas, said first active area forming said first and second conduction regions of said memory element, and said second active area forming said first and second conduction regions of said pass transistors, wherein the switch is a programmable switch that can pass or block data from the input terminal to the output terminal based on programmable ON/OFF operation of the switch.

2. The switch according to claim 1, further comprising a second pass transistor, having a first conduction region connected to an own input terminal and a second conduction region connected to an own output terminal, said second pass transistor, said memory element and said pass transistor sharing said common-gate regions.

3. The switch according to claim 1 wherein said common-gate regions extend parallel to one another on top of said body of semiconductor material.

4. The switch according to claim 1 wherein said body accommodates a third active area forming a third and a fourth conduction region of said pass transistor, said common-gate regions extending in a direction transverse to, and on top of, said third active area, said first and third conduction regions of said pass transistor being electrically connected by a first line of conductive material, extending on top of said body, said second and fourth conduction regions of said pass transistor being electrically connected by a second line of conductive material, extending on top of said body, said first and second line of conductive materials being arranged on opposite sides of said common-gate regions and being connected to respective biasing lines, which extend parallel to each other on top of, and transverse to, said common-gate regions.

5. The switch according to claim 1 wherein said body accommodates a fourth active area forming a first and a second conduction region of a second pass transistor, said common-gate regions extending in a direction transverse to, and on top of, said fourth active area.

6. The switch according to claim 5 wherein said body accommodates a fifth active area forming a third and a fourth conduction region of said pass transistor, said common-gate regions extending in a direction transverse to, and on top of, said fifth active area, said first and third conduction regions of said second pass transistor being electrically connected by a third line of conductive material, extending on top of said body, said second and fourth conduction regions of said second pass transistor being electrically connected by a fourth line of conductive material, extending on top of said body, said third and fourth lines of conductive material being arranged on opposite sides of said common-gate regions and being connected to respective biasing lines, extending parallel to each other on top of, and transverse to, said common-gate regions.

7. A method for controlling a nonvolatile switch comprising a memory element of flash type and a pass transistor, which have a common floating gate region and a common control gate region, the memory element and the pass transistor being integrated adjacent to each other, said method comprising:
  program biasing said common control gate region of said memory element and said pass transistor so as to inject charges into or extract charges from said common floating-gate region, wherein said program biasing includes:
    applying a first and a second potential, respectively, to a first and a second conduction region of said memory element, and applying a third potential to said common control gate region of said memory element and of said pass transistor in a writing operation;
    leaving said first conduction region of said memory element floating, applying a fourth potential to said second conduction region of said memory element, and applying a fifth potential to said common control gate region of said memory element and of said pass transistor in an erasing operation; and
    leaving said first conduction region of said memory element floating, applying a reference potential to said second conduction region of said memory element, applying a sixth potential to said common control gate region of said memory element and said pass transistor, and detecting possible data on an output terminal of said pass transistor; and
  selection biasing said common control gate region of said memory element and said pass transistor and supplying a datum to an input terminal of said pass transistor during operation of said switch, wherein based on a programmable ON/OFF state of the switch, the datum is passed to an output terminal of the switch by the pass transistor or blocked from the output terminal of the switch by the pass transistor.

8. An apparatus, comprising:
an input terminal;
an output terminal;
a selection terminal;
a first and a second biasing terminal;
a memory element of flash type, having a first conduction region coupled to said first biasing terminal and a second conduction region coupled to said second biasing terminal;
a pass transistor, having a first conduction region coupled to said input terminal and a second conduction region coupled to said output terminal;
a pair of common-gate regions, having a common floating gate region and a common control gate region, which are capacitively coupled together, said memory element and said pass transistor sharing said common-gate regions, and said common control-gate region being coupled to said selection terminal; and
a body of semiconductor material wherein said common gate regions extend parallel to one another on top of said body of semiconductor material, wherein said body accommodates a first and a second active area separated by an insulating region, said common-gate regions extending in a direction transverse to, and on top of, said first and second active areas, said first active area forming said first and second conduction regions of said memory element, and said second active area forming said first and second conduction regions of said pass transistor.

9. The apparatus of claim 8 wherein said body accommodates a third active area forming a third and a fourth conduction region of said pass transistor, said common-gate regions extending in a direction transverse to, and on top of, said third active area, said first and third conduction regions of said pass transistor being electrically connected by a first line of conductive material, extending on top of said body, said second and fourth conduction regions of said pass transistor being electrically connected by a second line of conductive material, extending on top of said body, said first and second line of conductive materials being arranged on opposite sides of said common-gate regions and being connected to respective biasing lines, which extend parallel to each other on top of, and transverse to, said common-gate regions.

10. The apparatus of claim 8 wherein said body accommodates a fourth active area forming a first and a second conduction region of a second pass transistor, said common-gate regions extending in a direction transverse to, and on top of, said fourth active area.

11. The apparatus of claim 10 wherein said body accommodates a fifth active area forming a third and a fourth conduction region of said pass transistor, said common-gate regions extending in a direction transverse to, and on top of, said fifth active area, said first and third conduction regions of said second pass transistor being electrically connected by a third line of conductive material, extending on top of said body, said second and fourth conduction regions of said second pass transistor being electrically connected by a fourth line of conductive material, extending on top of said body, said third and fourth lines of conductive material being arranged on opposite sides of said common-gate regions and being connected to respective biasing lines, extending parallel to each other on top of, and transverse to, said common-gate regions.

* * * * *

UNITED STATES PATENT AND TRADEMARK OFFICE
CERTIFICATE OF CORRECTION

PATENT NO. : 7,088,135 B2 Page 1 of 1
APPLICATION NO. : 10/760637
DATED : August 8, 2006
INVENTOR(S) : Chantal Auricchio et al.

It is certified that error appears in the above-identified patent and that said Letters Patent is hereby corrected as shown below:

<u>Title Page</u>
Item (75), Inventor information, the city of residence of first named inventor, Chantal Auricchio, should read -- Cassina de' Pecchi (IT) --.

Signed and Sealed this

Third Day of July, 2007

JON W. DUDAS
*Director of the United States Patent and Trademark Office*